United States Patent
Manita et al.

(10) Patent No.: US 8,704,402 B2
(45) Date of Patent: Apr. 22, 2014

(54) ANTITHEFT APPARATUS FOR EQUIPMENT WITH PRIME MOVER

(75) Inventors: Masashi Manita, Wako (JP); Makoto Yamamura, Wako (JP); Masato Takeda, Wako (JP); Kosei Yamashita, Wako (JP); Yoshihisa Shinogi, Wako (JP); Yoshinori Maekawa, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 806 days.

(21) Appl. No.: 12/960,672

(22) Filed: Dec. 6, 2010

(65) Prior Publication Data

US 2011/0133550 A1    Jun. 9, 2011

(30) Foreign Application Priority Data

Dec. 9, 2009    (JP) .................................. 2009-279931

(51) Int. Cl.
*B60R 25/04* (2013.01)
(52) U.S. Cl.
USPC ....................................................... 307/10.3
(58) Field of Classification Search
USPC ........... 307/10.1, 10.2, 10.3, 10.4, 10.5, 10.6; 340/426.3, 5.6; 701/2
See application file for complete search history.

(56) References Cited

U.S. PATENT DOCUMENTS

| | | | |
|---|---|---|---|
| 3,737,670 A | | 6/1973 | Larson |
| 4,190,785 A | * | 2/1980 | Kompanek ....................... 341/34 |
| 5,561,430 A | * | 10/1996 | Knebelkamp ................... 342/44 |
| 5,739,766 A | * | 4/1998 | Chaloux ..................... 340/10.41 |
| 8,548,645 B2 | * | 10/2013 | Long .................................... 701/2 |
| 2002/0112942 A1 | | 8/2002 | Galmiche et al. |
| 2006/0131959 A1 | | 6/2006 | Nishijima et al. |
| 2010/0052849 A1 | * | 3/2010 | Steegmann et al. ........... 340/5.64 |

FOREIGN PATENT DOCUMENTS

| | | |
|---|---|---|
| EP | 1 403 153 A1 | 3/2004 |
| EP | 2 098 419 A2 | 9/2009 |
| JP | 2004-116176 A | 4/2004 |
| JP | 2004-314806 A | 11/2004 |
| JP | 2007-090908 A | 4/2007 |
| JP | 2007-112363 A | 5/2007 |
| JP | 2007-137211 A | 6/2007 |
| WO | WO 2007/096304 A1 | 8/2007 |

\* cited by examiner

*Primary Examiner* — Daniel Cavallari
(74) *Attorney, Agent, or Firm* — Arent Fox LLP

(57) ABSTRACT

In an apparatus for preventing theft of equipment (electric motor) having a prime mover (motor), a prime mover controller, a starter switch that allows the operator to connect/disconnect power from a power source to the prime mover; and an authenticator that acquires ID information from an electronic key through a receiver when the key is brought close thereto by the operator, and permits the controller to start the prime mover when acquired ID information is determined to correspond with authentication ID information, the starter switch is made of electrode pair that is sensitive to electrostatic capacitance, and the starter switch and the receiver are installed together on an electronic circuit board, thereby achieving the smaller structure of the apparatus.

7 Claims, 4 Drawing Sheets

ANTITHEFT APPARATUS FOR EQUIPMENT WITH PRIME MOVER

BACKGROUND OF THE INVENTION

1. Field of the Invention

This invention relates to an antitheft apparatus for equipment with a prime mover.

2. Description of the Related

Conventionally, an antitheft apparatus (so-called an "immobilizer") for equipment like a vehicle having a prime mover is known which, when an electronic key storing ID information is manipulated by the operator, acquires the ID information through a receiver (antenna), sends it to an immobilizer controller to verify it with authentication ID information, and only when the authentication is verified (the ID information is valid), allows the prime mover to be started with the electronic key, thereby preventing theft, as taught, for example, by Japanese Laid-Open Patent Application No. 2007-90908.

SUMMARY OF THE INVENTION

In such the configuration, a starter switch to be manipulated by the operator to start the prime mover is a switch of keyhole type or press-button type and provided separately from the receiver that acquires the ID information of the electronic key. The keyhole or press-button type switch tends to be large due to their mechanical structure, and since it is provided separately from the receiver, a space for the installation is required for each, resulting in the increase of the antitheft apparatus in size.

An object of this invention is therefore to overcome the aforesaid problem by providing an antitheft apparatus for equipment with a prime mover, in which apparatus a starter switch is configured to be small and also a receiver is made integral with the starter switch, thereby achieving the smaller structure of the apparatus.

In order to achieve the object, this invention provides an apparatus for preventing theft of equipment having a prime mover, an prime mover controller that controls operation of the prime mover, a starter switch that allows the operator to connect/disconnect power from a power source to the prime mover; and an authenticator that acquires ID information from an electronic key through a receiver when the key is brought close thereto by the operator, determines whether the acquired ID information corresponds with authentication ID information, and permits the prime mover controller to start the prime mover when the acquired ID information is determined to correspond with the authentication ID information, characterized in that: the starter switch comprises electrode pair that is sensitive to electrostatic capacitance; and the electrode pair and the receiver are installed together on an electronic circuit board.

BRIEF DESCRIPTION OF THE DRAWINGS

The above and other objects and advantages of the invention will be more apparent from the following description and drawings in which.

DETAILED DESCRIPTION OF THE PREFERRED EMBODIMENTS

An antitheft apparatus for equipment with a prime mover according to embodiments of the invention will now be explained with reference to the attached drawings.

Figure 1:
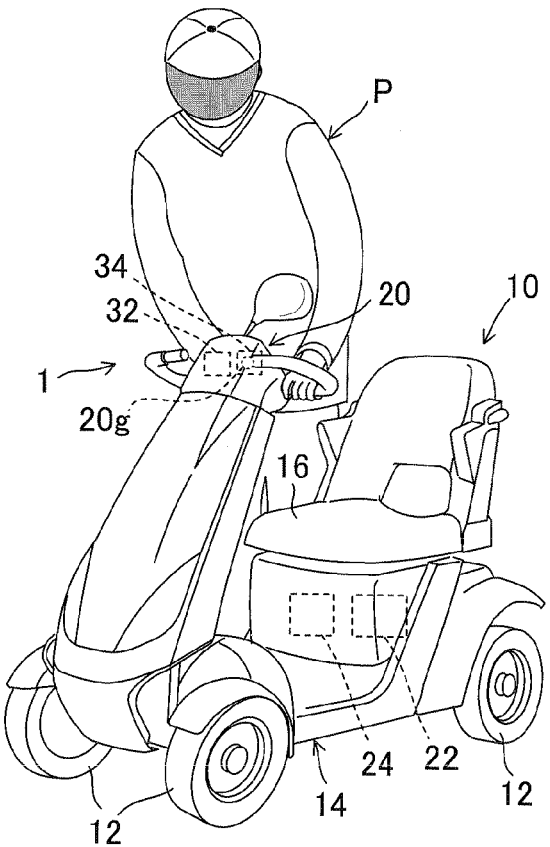
FIG. 1 is an overall schematic view of an antitheft apparatus for equipment with a prime mover according to an embodiment of the invention, including a small electric vehicle in which the apparatus is installed.

FIG. 1 is an overall schematic view of an antitheft apparatus for equipment with a prime mover according to an embodiment of the invention, including a small electric vehicle in which the apparatus is installed.

In FIG. 1, reference numeral 1 indicates the antitheft apparatus for equipment with a prime mover. In the following, the explanation will be made by taking a small electric vehicle as an example of the equipment.

The small electric vehicle is assigned by reference numeral 10. The vehicle 10 is a relatively small, single-passenger, electric vehicle, precisely an electric wheelchair or electric four-wheel scooter equipped with a body frame 14 supported by four wheels 12 (one of which is not shown in FIG. 1), a seat 16 installed on the frame 14 to be taken by the operator (person; user) P, and an operation unit 20 to be manually operated by the operator P. The vehicle 10 is a moving object that moves at extremely low speed, i.e., at a human walking speed, and is suitable for the elderly.

An electric motor 22 for driving the wheels 12 (specifically rear wheels) and a battery 24 for supplying operating power to the motor 22 are installed under the seat 16. The motor 22 comprises a DC brushless motor.

Figure 2:
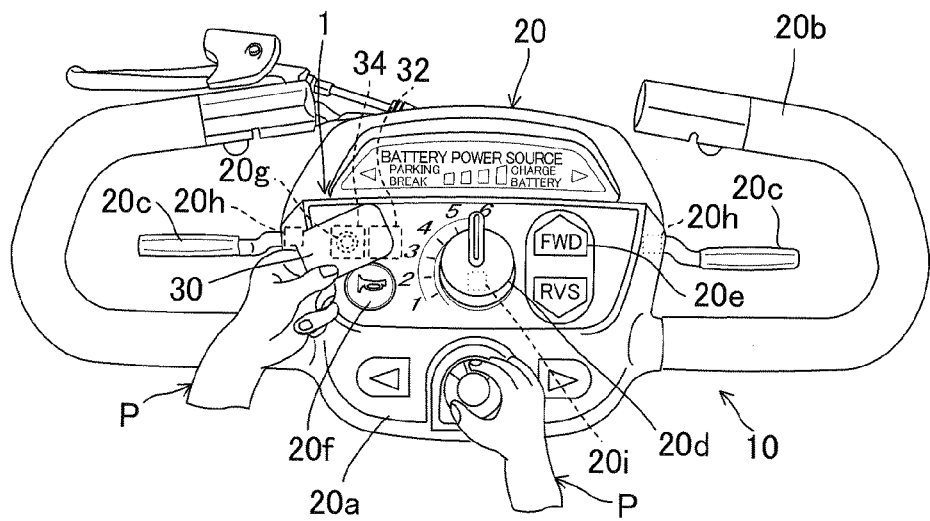
FIG. 2 is a front view of a control panel of the vehicle shown in FIG. 1.

FIG. 2 is a front view of the operation unit 20 of the vehicle 10 shown in FIG. 1.

As shown in FIG. 2, the operation unit 20 comprises a loop-shaped handle 20b laterally projecting, as curving, from a dashboard 20a, two drive levers 20c that laterally project and allow the operator P to input a moving/stopping instruction, a speed setting knob 20d that allows the operator P to set a desired travel speed within a range starting continuously from 1 km/h up to 6 km/h, forward/reverse switches 20e that allow the operator P to input a traveling direction instruction between forward and reverse travels, a horn switch 20f that allows the operator P to sound a horn (not shown), a starter switch (power switch) 20g that allows the operator P to connect/disconnect power from the battery (power source) 24 to the motor 22, and other components.

Two drive switches 20h are installed near the drive levers 20c. The drive switch 20h produces an ON signal when one of the drive levers 20c is manipulated by the operator P to drive and stops outputting the ON signal when manipulated by the operator P to stop. A speed setting knob sensor 20i is installed near the knob 20d and produces an output or signal (speed instruction) corresponding to the desired travel speed set by the operator P through the speed setting knob 20d.

Details of the vehicle 10 are described in Japanese Laid-Open Patent Application No. 2007-112363 proposed by the applicant earlier and the further explanation is omitted here.

Figure 3:
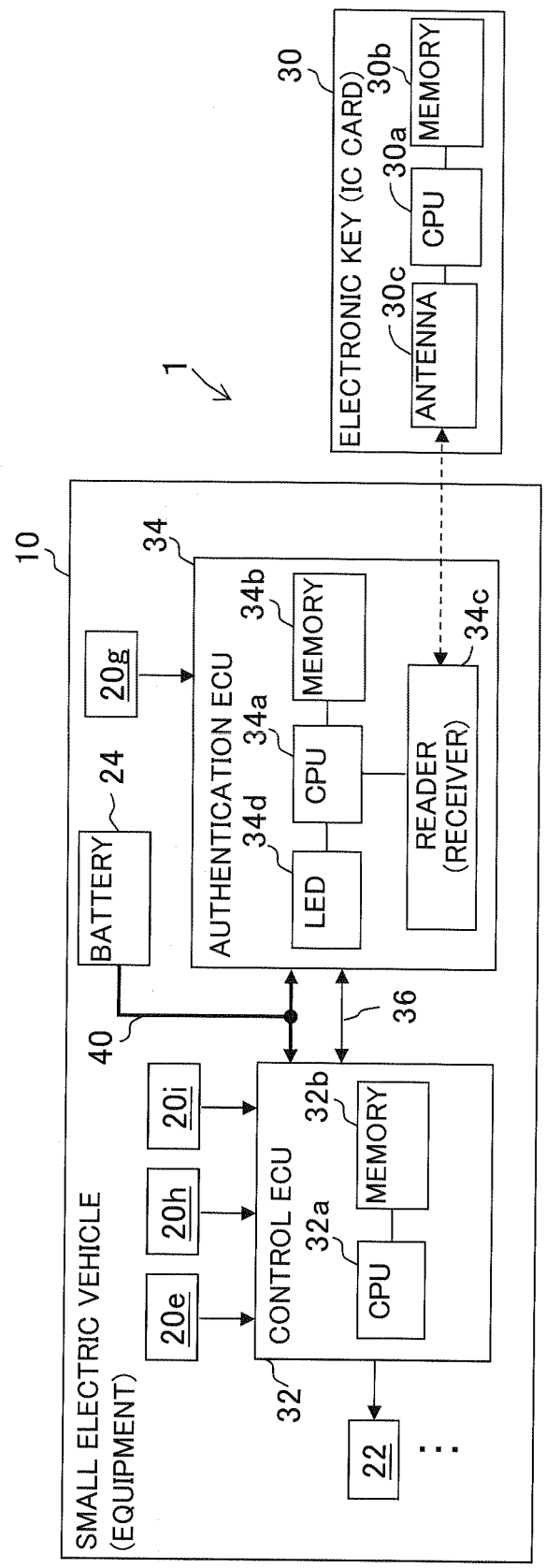
FIG. 3 is a block diagram showing the configuration of the apparatus shown in FIG. 1.

FIG. 3 is a block diagram showing the configuration of the apparatus 1 of the vehicle 10.

The apparatus 1 comprises an electronic key (IC card) 30 that stores ID information (explained later), a control ECU (Electronic Control Unit) 32 installed in the vehicle 10 for controlling the operation of the motor 22, and an authentication ECU (Electronic Control Unit) 34 installed in the vehicle 10 for authenticating the key 30. The ECUs 32, 34 are disposed at appropriate locations in the vehicle 10, specifically in the interior of the dashboard 20a of the operation unit 20, as clearly shown in FIG. 2.

The control ECU 32 comprises a microcomputer having a CPU 32a, a memory (EEPROM or non-volatile memory) 32b and other components. The control ECU 32 is inputted by the operator P with a traveling direction instruction through the forward/reverse switch 20e, a drive instruction through the drive switch 20h, and a speed instruction through the speed setting knob sensor 20i. The control ECU 32 controls the operation of the motor 22 and the like in response to those instructions, thereby controlling the operation of the vehicle 10.

Specifically, the operator P selects a traveling direction using the forward/reverse switch 20e and sets desired travel speed using the speed setting knob 20d. Then, when the operator P grips or grasps one of (or both of) the drive levers 20c with the handle 20b, the vehicle 10 starts moving at the set speed, and when the operator P releases it, the vehicle 10 stops.

The authentication ECU 34, similarly to the control ECU 32, comprises a microcomputer having a CPU 34a, a memory (EEPROM or non-volatile memory) 34b for storing authentication ID information, and other components.

The authentication ECU 34 further comprises a reader (receiver) 34c for reading (receiving) the ID information stored in the key 30, and an indicator 34d comprising an LED (Light-Emitting Diode).

The so-configured authentication ECU 34 is connected to the control ECU 32 through a communication line 36. A start enable signal, which will be explained later, is transmitted from the authentication ECU 34 to the control ECU 32 through the communication line 36. The ECUs 32, 34 are connected to the battery 24 through a power line 40 to be supplied with operating power from the battery 24.

The key 30 comprises a CPU 30a, a memory 30b for storing the ID information (precisely, identification data (operator ID) for identifying the operator P who carries the key 30, identification data (product ID) for identifying the model, product number, etc., of the vehicle 10), and an antenna 30c for transmitting the ID information to the reader 34c by short-distance wireless communication (RFID: Radio Frequency Identification). The key 30 is made of resin and houses the CPU 30a and other components in its interior. The key 30 has a card shape of business card size to be portable.

There now follows an explanation of the authentication operation between the key 30 and authentication ECU 34. When the key 30 is brought close to and held over the reader 34c by the operator P with the authentication ECU 34 being supplied with operating power from the battery 24, the reader 34c can output (transmit) radio wave to the key 30.

Upon receipt of the radio wave from the reader 34c, the key 30 generates power by electromagnetic induction of a built-in coil (not shown), thereby activating the CPU 30a. In other words, the key 30 is not equipped with a battery or other internal power supply source but is supplied with operating power induced by the radio wave from the reader 34c.

When supplied with power, the key 30 outputs the ID information stored in the memory 30b to the reader 34c through the antenna 30c. The authentication ECU 34 acquires the ID information from the key 30 through the reader 34c and determines whether the acquired ID information corresponds with the authentication ID information stored in the memory 34b (i.e., the authentication operation is conducted).

When the above two data of ID information correspond with each other, the authentication ECU 34 determines that the key 30 brought close to the reader 34c is an authorized key for the vehicle 10 and sends the start enable signal to the control ECU 32. As a result, the control ECU 32 makes the motor 22 ready for start. Under this condition, when the starter switch 20g is made ON, power is supplied from the battery 24 to the motor 22, and when the operator P grasps the drive lever 20c, the motor 22 is driven thereby.

In contrast, when the two data of ID information do not correspond with each other, the authentication ECU 34 determines that the key 30 is not an authorized key and hence, does not send the start enable signal to the control ECU 32. Therefore, even when the starter switch 20g is made ON, power is not supplied from the battery 24 to the motor 22 and even if the operator grasps the drive lever 20c, the motor 22 is not driven.

Thus, the apparatus 1 is configured such that, when the ID information of the key 30 corresponds with the authentication ID information, the authentication ECU 34 enables or allows the motor 22 to start, while, when the two data of ID information do not correspond with each other, it does not enable or allow the motor 22 to start, thereby preventing theft of the vehicle 10.

The apparatus 1 according to this embodiment is characterized in that the starter switch 20g is configured to be integral with the reader 34c.

Figure 4:
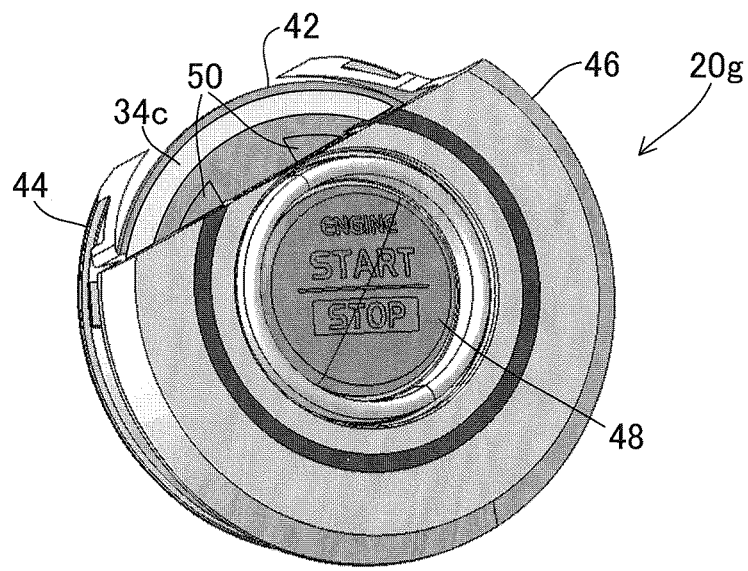
FIG. 4 is an enlarged view of a starter switch shown in FIG. 2.
Figure 5:
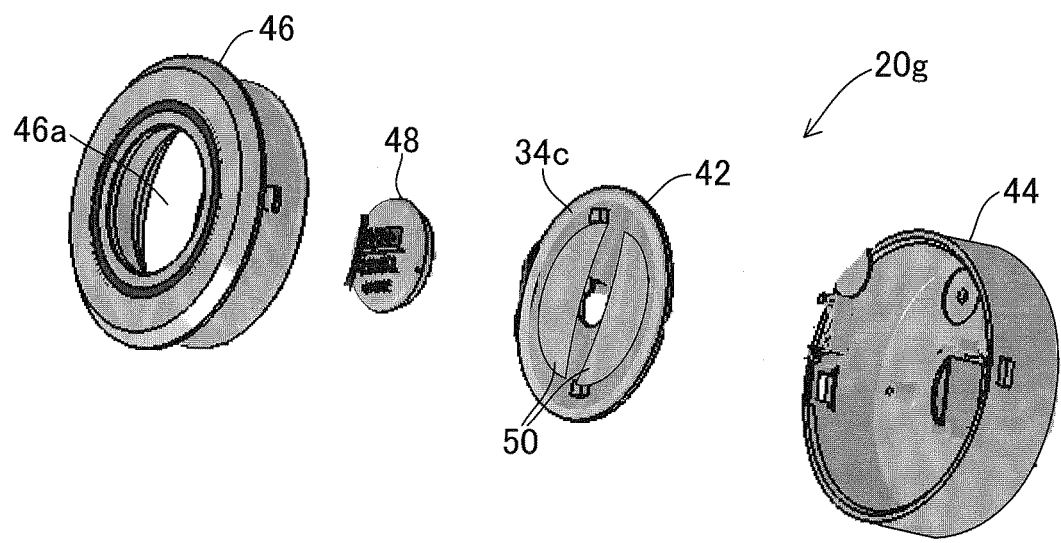
FIG. 5 is an exploded perspective view of the starter switch shown in FIG. 4.

FIG. 4 is an enlarged view of the starter switch 20g shown in FIG. 2 and FIG. 5 is an exploded perspective view thereof. FIG. 4 is partially shown in section for exhibiting the interior of the starter switch 20g.

The starter switch 20g comprises an electronic circuit board 42, a case 44 for accommodating the circuit board 42, a cap 46 for covering an opening 46a of the case 44, and a conductive rubber member 48 adapted to be embedded in a central opening of the cap 46 to be positioned in the vicinity of the circuit board 42.

The circuit board 42 is made of resin and has a disk shape with a diameter of 3 cm or thereabout. The circuit board 42 is mounted with electrode pair 50 having a plurality of (i.e., two) electrodes made of conductive metal (e.g., aluminum) plates to be sensitive to electrostatic capacitance. In the electrode pair 50, each electrode has a fan (or semicircular) shape, are allocated on the same plane of the circuit board 42 as spaced apart from each other. A thickness of the electrode is 0.5 mm or thereabout.

The electrode pair 50 are connected to a known oscillating circuit (not shown) having a comparator, flip-flop, transistor, etc. Electrostatic capacitance between the pair of the electrodes is detected from pulse waveform produced by the oscillating circuit.

Specifically, the starter switch 20g comprises a capacitance-sensitive type switch that is sensitive to the change in electrostatic capacitance through the electrode pair 50 to perform the switching. To be more specific, when the operator P touches the rubber member 48 softly, the rubber member 48 contacts the electrode pair 50, and consequently the capacitance therebetween changes. Based on the change in the capacitance, the starter switch 20g connects/cuts off current supply from the battery 24 to the motor 22.

The circuit board 42 is mounted also with the aforementioned reader 34c. Specifically, the reader 34c has a circular antenna pattern surrounding the electrode pair 50. When the key 30 is brought close to the antenna pattern, the ID information of the key 30 can be read as explained.

As stated above, the embodiment is configured to have an apparatus (1) for preventing theft of equipment (electric vehicle 10) having a prime mover (electric motor 22), an prime mover controller (control ECU 32) that controls operation of the prime mover, a starter switch (power switch 20g) that allows the operator to connect/disconnect power from a power source to the prime mover; and an authenticator (authentication ECU 34) that acquires ID information from an electronic key (30) through a receiver (reader 34c) when the key is brought close thereto by the operator, determines whether the acquired ID information corresponds with authentication ID information, and permits the prime mover controller to start the prime mover when the acquired ID information is determined to correspond with the authentication ID information, characterized in that: the starter switch (20g) comprises electrode pair (50) that is sensitive to electrostatic capacitance; and the electrode pair (50) and the receiver (34c) are installed together on an electronic circuit board (42).

Specifically, the starter switch 20g is configured to be the capacitance-sensitive type switch having the electrode pair 50 and be installed or mounted together with the receiver (reader) 34c on the same electronic circuit board 42. With this, it becomes possible to make the starter switch 20g small and save a space for the installation of the starter switch 20g and receiver (reader) 34c, thereby achieving the smaller structure of the apparatus.

Further, since the starter switch 20g is the capacitance-sensitive type switch, it has no movable portion in terms of its mechanical structure, thereby improving water-resisting property compared to keyhole and press-button type switches.

In the apparatus, the receiver (34c) is configured to surround the electrode pair (50).

In other words, since the electrode pair 50 and the receiver (reader) 34c are installed on the same electronic circuit board 42 to be able to keep a broad area of the receiver 34c, it becomes possible to achieve the small structure of the apparatus, while ensuring a sufficient area of the receiver 34c for receiving or acquiring the ID information of the key 30.

In the apparatus, the starter switch (20g) has a case (44) for accommodating the electronic circuit board (42) on which the starter switch and the receiver are installed, a cap (46) for covering the case (44), and a conductive rubber member (48) adapted to be embedded in an opening (46a) of the cap (46) to be positioned in the vicinity of the circuit board (42).

In the apparatus, each of the electrodes of the electrode pair (50) has a fan shape such that the electrodes are allocated spaced apart from each other.

In the apparatus, each of the electrodes of the electrode pair (50) has a linear shape with several curvatures such that the electrodes are arranged close to each other.

In the apparatus, wherein the equipment comprises an electric vehicle (10) and the prime mover comprises an electric motor (22).

Figure 6:
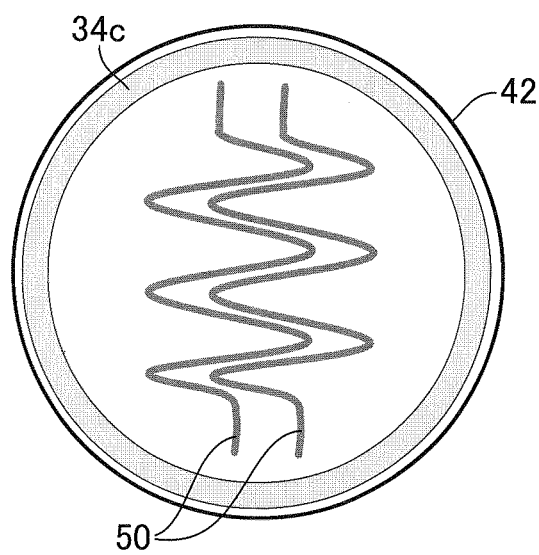
FIG. 6 is a schematic view showing an alternative example of an electronic substrate shown in FIG. 5.

It should be noted that, although, in the foregoing, the electrode pair have fan (or semicircular) shapes, as shown in FIG. 6, they may have linear shapes with several curvatures and be arranged close to each other to be sensitive to the change of capacitance more easily.

It should also be noted that, as long as the change of capacitance is detectable, the conductive rubber member can be removed from the starter switch and it may be configured so that a finger of the operator directly touches the electrode pair. In other words, the conductive rubber member is not necessarily required and if it is not installed, the starter switch can be made smaller further.

It should be noted also that, although the battery (24) is used to supply power to the authentication ECU, another dedicated battery could instead be installed in the authentication ECU for dealing with dark current of the battery (24) and it may be configured to supply power from the dedicated battery to the authentication ECU before the starter switch is made ON and change the supply source to the battery (24) after it has been made ON.

It should also be noted that the electronic key can be contact type. In other words, it suffices if the communication is established not by the wired communication but by the wireless communication. The electronic key may be incorporated in a mobile phone.

Japanese Patent Application No. 2009-279931, filed on Dec. 9, 2009, is incorporated by reference herein in its entirety.

While the invention has thus been shown and described with reference to specific embodiments, it should be noted that the invention is in no way limited to the details of the described arrangements; changes and modifications may be made without departing from the scope of the appended claims.

What is claimed is:

1. An apparatus for preventing theft of equipment having a prime mover, an prime mover controller that controls operation of the prime mover, a starter switch that allows the operator to connect/disconnect power from a power source to the prime mover; and an authenticator that acquires ID information from an electronic key through a receiver when the key is brought close thereto by the operator, determines whether the acquired ID information corresponds with authentication ID information, and permits the prime mover controller to start the prime mover when the acquired ID information is determined to correspond with the authentication ID information,
    characterized in that:
    the starter switch comprises electrode pair that is sensitive to electrostatic capacitance; and
    the electrode pair and the receiver are installed together on an electronic circuit board.

2. The apparatus according to claim 1, wherein the receiver is configured to surround the electrode pair.

3. The apparatus according to claim 1, wherein the starter switch has a case for accommodating the electronic circuit board on which the starter switch and the receiver are installed, a cap for covering the case, and a conductive rubber member adapted to be embedded in an opening of the cap to be positioned in the vicinity of the circuit board.

4. The apparatus according to claim 1, wherein each of the electrodes of the electrode pair has a fan shape such that the electrodes are allocated spaced apart from each other.

5. The apparatus according to claim 1, wherein each of the electrodes of the electrode pair has a linear shape with several curvatures such that the electrodes are arranged close to each other.

6. The apparatus according to claim 1, wherein the equipment comprises an electric vehicle.

7. The apparatus according to claim 6, wherein the prime mover comprises an electric motor.

* * * * *